United States Patent
Cable

(10) Patent No.: US 6,509,855 B1
(45) Date of Patent: Jan. 21, 2003

(54) DIGITAL-TO-ANALOG CELL HAVING REDUCED POWER CONSUMPTION AND METHOD THEREFOR

(75) Inventor: Andrew L. Cable, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/606,366

(22) Filed: Jun. 28, 2000

(51) Int. Cl.[7] .............................................. H03M 1/66
(52) U.S. Cl. ..................... 341/144; 341/153; 341/136; 323/316; 327/436
(58) Field of Search ......................... 327/436; 341/135, 341/136, 144, 153; 323/315, 316

(56) References Cited

U.S. PATENT DOCUMENTS

| | | | | |
|---|---|---|---|---|
| 4,677,323 A | * | 6/1987 | Marsh | 307/571 |
| 5,598,095 A | * | 1/1997 | Schnaitter | 323/315 |
| 5,844,511 A | * | 12/1998 | Izumikawa | 341/136 |
| 5,917,341 A | * | 6/1999 | Suder | 326/84 |
| 5,917,360 A | * | 6/1999 | Yasutake | 327/387 |

OTHER PUBLICATIONS

Allen et al., *CMOS Analog Circuit Design*, 1987 Oxford University Press, Inc. ISBN 0–19–510720–9, pp. 97 and 102.*

* cited by examiner

*Primary Examiner*—Howard L. Williams
(74) *Attorney, Agent, or Firm*—Kenneth M. Seddon

(57) ABSTRACT

Briefly, in accordance with one embodiment of the invention, a digital-to-analog cell includes an analog circuit that provides, at least in part, an output signal. Transistors may be coupled to the analog circuit to provide source-side switching of the analog circuit.

20 Claims, 2 Drawing Sheets

DIGITAL-TO-ANALOG CELL HAVING REDUCED POWER CONSUMPTION AND METHOD THEREFOR

BACKGROUND

Conventional digital-to-analog converters may include a digital-to-analog cell that receives a digital input signal, such as a voltage potential, and provides an output signal, such as a current flow. Simply speaking, a digital-to-analog cell may include an analog circuit that mirrors a reference current source to provide the output current. A switching circuit may be used to direct the output current flow depending on the logical value of the input signal.

One drawback to conventional digital-to-analog cells is that the switching circuit typically provides the output current directly from the power supply for at least one of the two input values. Consequently, the digital-to-analog cell may consume a large amount of power for half of the input values.

Another drawback of some conventional digital-to-analog circuits is that they may be referenced to the power supply voltage potential. As manufacturing techniques improve, it may be possible to manufacture transistors with smaller geometries, which may allow the power supply voltage potential to be reduced as well. However, since digital-to-analog cells are typically referenced to the power supply voltage potential, they may be difficult scale to take advantage of the decreasing geometry sizes. Consequently, at least a significant portion of conventional digital-to-analog cells may have to be redesigned before they may take advantage of improved manufacturing techniques. Thus, there is a continuing need for integrated circuits that have improved digital-to-analog cells that consume less power and that may be scaled to take advantage of improvements in manufacturing technology.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
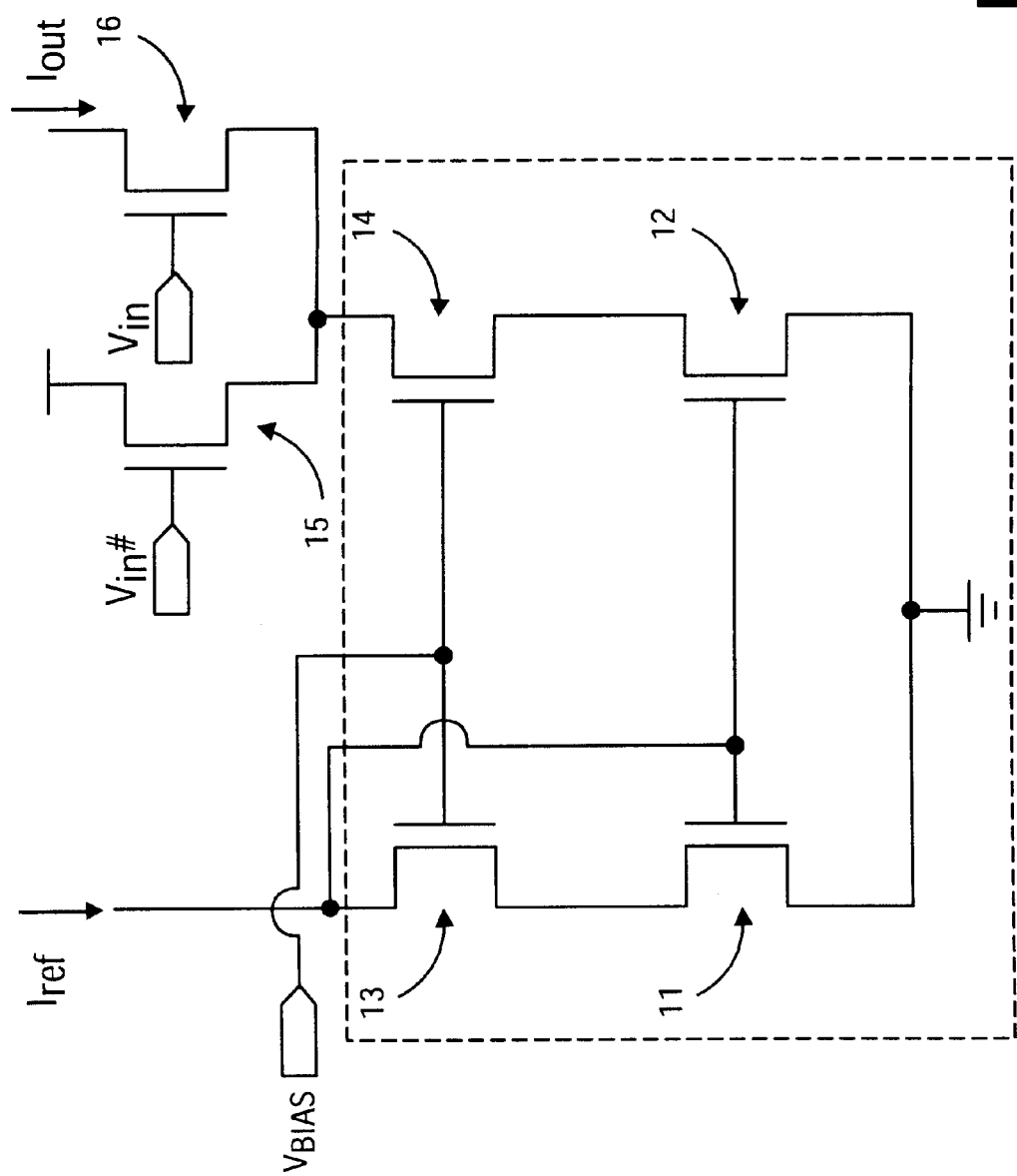
FIG. 1 is a schematic representation of a digital-to-analog cell using drain-side switching.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Note, in this description a "#" symbol may be used to indicate the logical complement of a signal. For example, if BL is a logic "1," then BL# may be a logic "0," although this invention is not limited to any particular signaling scheme. Further, in the following description and claims, the terms "coupled" and "connected," along with their derivatives, may be used. It should be understood that these terms are not intended as synonyms for each other. Rather, in particular embodiments, "connected" may be used to indicate that two or more elements may be in direct physical or electrical contact with each other. "Coupled" may also mean that two or more elements are in direct physical or electrical contact. However, "coupled" also includes embodiments where two or more elements are not in direct contact with each other, but yet co-operate or interact with each other.

Turning to FIG. 1, a conventional digital-to-analog (DA) cell 10 is described. Simply stated, DA cell 10 includes an analog circuit 20 that may be arranged to mirror the input reference current, $I_{ref}$. Analog circuit 10 may comprise transistors 11–14 that are typically in a saturated, steady-state condition when DA cell 10 is in operation. DA cell 10 may also include a drain-side switching circuit (e.g., transistors 15–16) that may be used to direct the flow of the output current, $I_{out}$, depending on the logical value of the input signal, $V_{in}$.

The term "drain-side" indicates that the switching circuit (e.g., transistors 15–16) is connected to the drain terminal of one of the transistors in analog circuit 20. For example, transistors 15–16 are connected to the drain terminal of transistor 14. Drain-side switching is often used in conventional digital-to-analog cells because it is generally accepted that the operation of analog circuit 20 should not be altered once analog circuit 20 has reached a steady-state condition. For example, if a current flow or voltage potential is changed on an analog circuit (e.g., analog circuit 20), there may often be a delay before the analog circuit adjusts to the change and returns to at steady-state condition. While the analog circuit is adjusting, the output of the analog circuit may no longer reflect the mirroring of the input current signal, and thus, the output of the analog circuit may be unreliable while the analog circuit adjusts. Consequently, a time delay may be introduced to allow the analog circuit to return to a steady-state condition. Thus, drain-side switching may be used in conventional digital-to-analog circuits so that changes in the output current signal, due to changes in the input signal, do not impact the operation of the analog mirroring circuit.

During operation, if $V_{in}$ is at a high voltage potential (e.g., the positive power supply rail), then transistor 16 may provide a current path to ground for $I_{out}$ through analog circuit 10. However, if the input signal is low, for example, $V_{in}$ is a low voltage potential, then transistor 16 may be turned off so that transistor 15 provides the current for transistors 14 and 12. To reduce the risk of substantially affecting the operation of analog circuit 10, it may be desirable that transistors 15–16 be matched so that the flow of current through transistors is not substantially affected when the input signal, $V_{in}$, is changed. This may complicate and increase the cost of the manufacturing technique used to make DA cell 10.

Another draw back with DA cell 10 is that a direct current path between the power supply voltage potential and the ground voltage potential may be created through transistor 15 when the input signal, $V_{in}$# is in a high voltage state. In this state, DA cell 10 may consume a significant amount of power. Another disadvantage of DA cell 10 is that the circuit may be referenced to the power supply voltage, typically $V_{DD}$. Consequently, the circuit shown may have to be redesigned in order to scale the circuit to take advantage of advances in multi-supply manufacturing technology.

Figure 2:
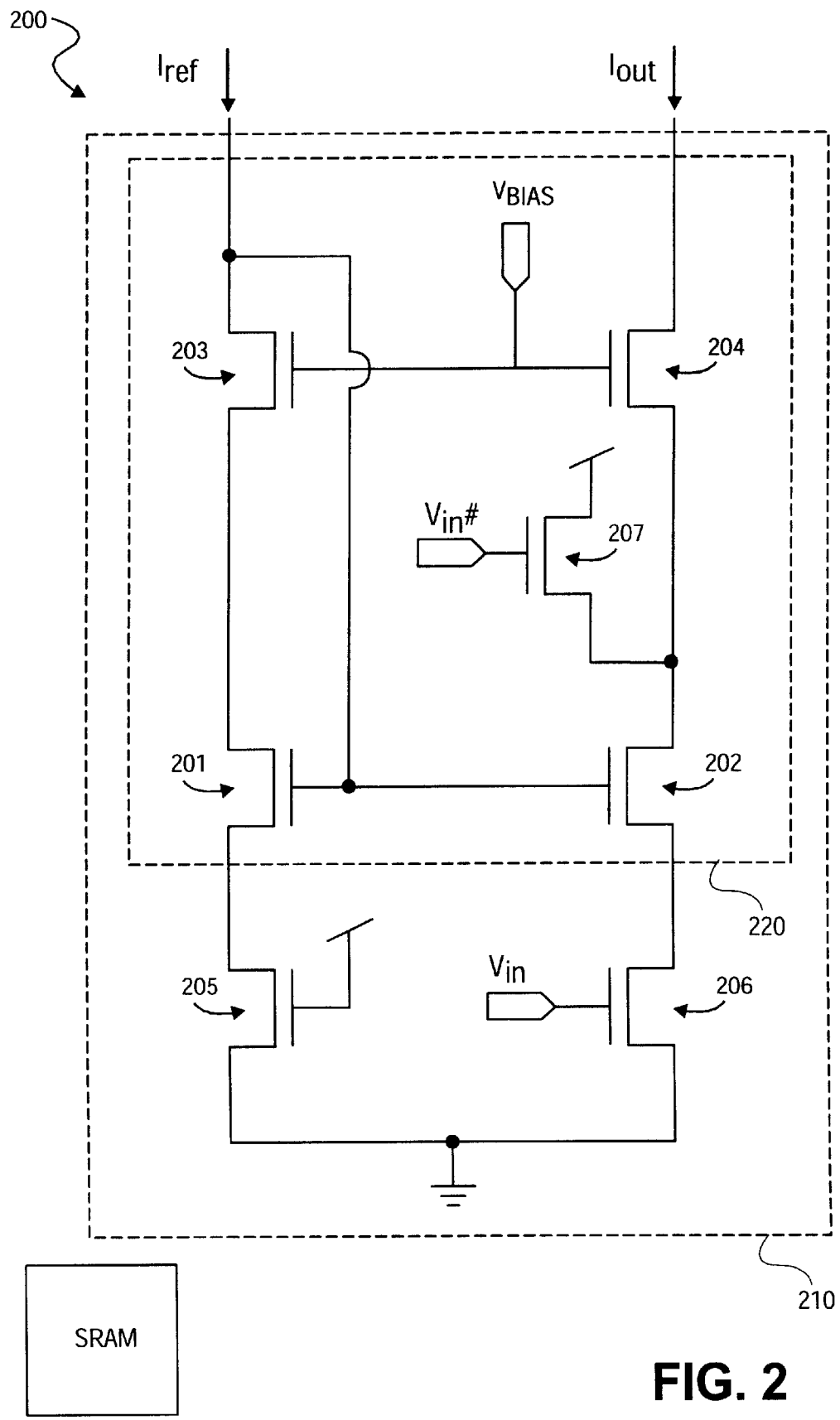
FIG. 2 is a schematic representation of a digital-to-analog cell using source-side switching in accordance with an embodiment the present invention.

Turning to FIG. 2, an embodiment 200 in accordance with the present invention is described. Embodiment 200 may comprise a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Embodiment 200 here includes an integrated circuit 250 that may comprise, for example, a microprocessor, a digital signal processor, a microcontroller, or the like. Embodiment 200 may also include other components (not shown) such as a static random access memory (SRAM), a user input device, and a display. However, it should be understood that the scope of the present invention is not limited in this respect. Integrated circuit 250 may also comprise a digital-to-analog (DA) cell 210 that may be used to convert a digital input signal and provide an analog output signal. Although the scope of the present invention is not limited in this respect, in this particular embodiment, an input signal, labeled $V_{in}$, may represent a digital logic value that may be converted to an output signal, labeled $I_{out}$. As explained in more detail below, the magnitude of $I_{out}$ may be determined, at least in part, by the magnitude of a reference current source (e.g., $I_{ref}$).

DA cell 210 may include an analog circuit 220 comprising transistors 201–204. As shown, analog circuit 220 may be powered with a bias voltage potential, $V_{Bias}$, so that the flow of current through transistor 204, $I_{out}$, may approximately mirror the current through transistor 203, $I_{ref}$. For example, $V_{bias}$, may be approximately 1.0 to 3.0 volts, although the magnitude of $V_{bias}$ in alternative embodiments may be changed as desired. In addition, it should be understood that the scope of the present invention is not limited to embodiments where $I_{ref}$ is approximately equal to $I_{out}$. Rather, the scope of the present invention includes embodiments where $I_{out}$ may be merely proportional to $I_{ref}$. For example, the magnitude of lot may be a multiple or a fraction of $I_{ref}$ depending on many factors, such as the relative sizing of transistors 201–204. In addition, it should be understood that the scope of the present invention is not limited by the magnitude of $V_{bias}$ or how $V_{bias}$ may be provided to analog circuit 220. For example, in alternative embodiments the gate of transistors 203–204 may be connect to the input reference current source, $I_{ref}$.

DA cell 210 may include a source-side switching transistor 206 that connects at least a portion of analog circuit 220 to the ground voltage potential, or a close approximation thereof. The gate of transistor 206 may receive the input signal $V_{in}$ so that when a sufficiently high voltage potential is applied to the gate of transistor 206, transistors 202 and 204 may provide a current path for $I_{out}$ through analog circuit 200 that approximately mirrors the input current $I_{ref}$. For example, if $V_{in}$ is sufficiently high (e.g. sufficiently above the threshold voltage of transistor 206), transistor 206 may connect DA cell 210 to one of the power supply voltages, such as ground as shown in FIG. 2.

If input signal, $V_{in}$, is sufficiently low, transistor 206 may be disabled, which, in turn, disables the flow of current through transistor 206. By disabling transistor 206, an "open" in the current path of $I_{out}$ to the ground voltage potential may be created so that the magnitude of $I_{out}$ may be approximately equal to zero. As a sufficiently low voltage potential is applied to transistor 206, the logical complement, $V_{in}\#$, may be applied to transistor 207 as shown in FIG. 2. The voltage potential of $V_{in}\#$ may enable transistor 207 so that the source terminal of transistor 204 may be connected to a voltage potential that may be approximately equal to the positive power supply rail voltage (e.g. $V_{DD}$) minus a threshold voltage ($V_t$) drop associated with transistor 207. By raising the voltage potential on the source terminal of transistor 204 so that the gate-source voltage ($V_{gs}$) is less than the threshold voltage ($V_t$), transistor 204 may be turned off.

As shown in FIG. 2, the gate terminal of transistor 202 receives the voltage potential associated with input reference current source, $I_{ref}$. Thus, transistor 202 may still be enabled even though transistors 204 and 206 may be disabled. Consequently, transistor 207 may also be used to remove charge remaining on the source, drain, or channel regions of transistors 202, 204, and 206. The combination of creating an electrical open in the current path with transistor 206, along with raising the voltage potential on the source terminal of transistor 205 with transistor 207, may rapidly turn off the flow of current that represents $I_{out}$. Accordingly, particular embodiments of the present invention may provide a digital-to-analog cell whose output signal, $I_{out}$, changes shortly after the input signal, $V_{in}$, changes. Thus, DA cell 210 may reduce the delay between when an input signal changes and when a valid output signal may be provided as compared to transition time of conventional digital-to-analog cells.

Conventionally, it is not desirable to alter the operation of the analog circuit of a digital-to-analog cell once the analog circuit has reached a stable, steady-state condition. However, particular embodiments of the present invention may do just that through source-side switching of the analog circuit to achieve unexpected results as discussed below. As mentioned earlier, if the input signal is a sufficiently low voltage potential, analog circuit 220 may be separated from its reference voltage potential (e.g., ground) by transistor 206. In addition, the voltage potential on the source of transistor 204 may be raised which disables the flow of current through transistor 204. Consequently, DA cell 210 may provide for source-side switching a portion of the current path (e.g., portions of analog circuit 210) that represents, at least in part, the output signal, $I_{out}$.

Although the scope of the present invention is not limited in this respect, in alternative embodiments it may be desirable to manufacture DA cell 210 so that transistors 203 and 204 are large, high voltage devices and transistors 201, 202, and 205–207 are small, low voltage devices. For example, transistors 203 and 204 may have an effective channel length of about 0.35 to 1.0 microns and a threshold voltage ranging from about 0.4 to 1.0 volts. In contrast, transistors 201, 202, and 205–207 may have an effective channel length ranging from about 0.1 to 0.5 microns and a threshold voltage ranging from about 0.2 to 0.5 volts. In such an arrangement, transistors 203–204 may have a smaller leakage current due to their higher threshold voltage. Consequently, the leakage current through DA cell 210 may be reduced when it is not in operation, which, in turn, may reduce the stand-by power consumption, overall power consumption, the offset error, and the gain error associated with DA cell 210.

This arrangement may also be desirable because transistors 203–204 may be coupled to external logic (not shown) that operates at higher voltage potentials (e.g., 1–5 volts).

Thus, DA cell 210 may reduce the amount of additional circuitry associated with stepping down the voltage potential provided by the reference current $I_{ref}$. Another advantage of this particular embodiment is that transistors 206 and 207 may be directly connected to other low-voltage circuitry within integrated circuit 250 (not shown) without using buffers or other circuitry to protect transistors 206 and 207 from voltage potentials that may damage their gate oxides. This may reduce the number of transistors used to implement DA cell 210, which, in turn, may reduce the size, power consumption, and manufacturing cost of integrated circuit 250.

Another advantage of implementing transistors 201–202 and 205–207 with low voltage devices is that transistor 206 may be able to quickly connect analog circuit 220 to the ground voltage potential when the input voltage potential, $V_{in}$, transitions from a low voltage potential to a high voltage potential. As explained above, when $V_{in}$ is sufficiently low, transistor 206 may be turned off and transistor 207 may be enabled to turn off transistor 204 and remove the charge from transistor 202. However, the voltage potential on the source of transistor 202 may still be approximately equal to ground voltage potential ($V_{ss}$) plus the gate-to-source voltage ($V_{gs}$) of transistor 201 minus the threshold voltage potential of transistor 202. Thus, when transistor 206 is turned on, transistor 206 may quickly enter saturation mode and the current path for the output signal, $I_{out}$, may provided in a timely fashion.

In yet another alternative embodiment of the present invention, the gate oxide thickness of transistors 201–207 may be varied so transistors 203–204 have a higher threshold voltage than transistors 201–202 and 205–207. For example, transistors 203–204 may be formed so that they have a gate oxide thickness ranging from approximately 30–300 angstroms whereas transistors 201–202 and 205–207 may have a gate oxide thickness ranging from about 10–100 angstroms. By forming transistors 201–207 so some transistors have a gate oxide or a threshold voltage that may be at least twice that of other transistors, it may be easier to integrate DA cell 210 with other circuitry. However, the present invention is not limited in scope by the size or electrical characteristics of transistors 201–207.

One advantage of the particular embodiment shown in FIG. 2. is that transistors 201–207 may be n-channel transistors that may be referenced to the ground voltage potential. Accordingly, the circuit shown in FIG. 2 may be scaled to smaller geometries without having to redesign the circuit. Although the scope of the present invention is not limited in this respect, DA cell 210 may be formed in a smaller surface area because transistors 201–207 may be formed in the same well since p-channel transistors are not required. However, it should be understood that in alternative embodiments it may be possible to implement a digital-to-analog cell using p-channel devices as well. In such embodiments, transistors 201–207 may be replaced with p-channel devices, transistor 207 may be connected to a ground voltage potential, and transistor 206 may be connected to the positive power supply rail voltage potential (e.g., $V_{DD}$) to provide source-side switching.

By now it should be appreciated that particular embodiments of the present invention provides a digital-to-analog cell that may be faster and consume less power than conventional digital-to-analog cells. In particular embodiments, source-side switching may be used to disable an analog circuit to disable the flow of the output current signal. Consequently, power may be saved since current may not flow while the digital-to-analog cell provides one of the output signals.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An integrated circuit comprising a digital-to-analog cell, the digital-to-analog cell comprising:
   a first transistor having a gate terminal and a source terminal, wherein the gate terminal is adapted to receive an input signal, and wherein the digital-to-analog cell is adapted to receive a power supply voltage potential on the source terminal of the first transistor; and
   a second transistor adapted to provide a power supply voltage to the analog circuit, wherein the first transistor is enabled when the second transistor is disabled.

2. The integrated circuit of claim 1, wherein the first transistor is adapted to provide an electrical path to ground.

3. The integrated circuit of claim 1, wherein the first transistor is adapted to receive a power voltage potential approximately equal to ground.

4. The integrated circuit of claim 1, wherein the first transistor is an n-channel transistor.

5. The integrated circuit of claim 1, wherein the digital-to-analog cell includes an analog circuit comprising at least two transistors, and wherein the first transistor is adapted to disable the flow of current through at least a portion of the analog circuit.

6. The integrated circuit of claim 1, further comprising a third transistor adapted to provide an output current, wherein the third transistor has a source terminal coupled to the second transistor.

7. The integrated circuit of claim 6, further comprising a fourth transistor, wherein the fourth transistor is coupled to the source terminal of the third transistor and a drain terminal of the first transistor.

8. The integrated circuit of claim 6, wherein the first transistor and the third transistor have a threshold voltage, the threshold voltage of the third transistor being at least twice that of the threshold voltage of the first transistor.

9. The integrated circuit of claim 6, wherein the first transistor and the third transistor have a gate oxide, the gate oxide of the third transistor being at least twice as thick as the gate oxide of the first transistor.

10. The integrated circuit of claim 6, wherein the first transistor and the third transistor have an effective gate length, wherein the effective gate length of the third transistor is at least twice the effective gate length of the first transistor.

11. The integrated circuit of claim 1, wherein the digital-to-analog cell is adapted to receive a reference current, and wherein the digital-to-analog cell includes a current path adapted to provide an output current, the current path including the first transistor.

12. The integrated circuit of claim 5, wherein the second transistor comprises a gate terminal adapted to receive a complementary input signal that is the logical complement of the input signal.

13. An integrated circuit having a digital-to-analog cell, wherein the digital-to-analog cell is adapted to provide source-side switching, wherein the digital-to-analog cell includes:
   a first transistor adapted to provide an output current path, and wherein the output current path is provided by enabling the first transistor; and a second transistor adapted to receive a first input signal, and wherein the first transistor is adapted to selectively connect the current path to a power supply voltage.

14. The integrated circuit of claim 13, wherein the digital-to-analog cell includes a transistor adapted to connect at least a portion of the digital-to-analog cell to a power supply voltage potential to provide source-side switching.

15. The integrated circuit of claim 13, wherein the first transistor is adapted to receive a second input signal that is the logical complement of the first input signal.

16. An apparatus comprising;

a static random access memory device; and an integrated circuit coupled to the static random access memory device and having a digital-to-analog cell, wherein the digital-to-analog cell is adapted to provide source-side switching, wherein the digital-to-analog cell includes:

a first transistor adapted to provide an output current path, and wherein the output current path is provided by enabling the first transistor; and a second transistor adapted to receive a first input signal, and wherein the first transistor is adapted to selectively connect the current path to a power supply voltage.

17. A method of providing an output signal from a digital-to-analog converter comprising separating an analog circuit from its reference voltage potential, by enabling a first transistor with a first input signal and enabling a second transistor with a second input signal representing the logical complement of the first input signal.

18. The method of claim 17, further comprising coupling at least a portion of the analog circuit to a power supply voltage potential.

19. A method of disabling a current path through a digital-to-analog converter comprising source-side switching a portion of the current path by disabling at least a portion of an analog circuit by applying a first input signal to a gate terminal of a first transistor in the current path, and applying a second input signal to a gate terminal of a second transistor, the second input signal representing the logical complement of the first input signal.

20. The method of claim 19, further comprising coupling at least a portion of the current path to a power supply voltage with the second transistor.

* * * * *